March 10, 1970 H. Y. WONG 3,500,064

FIELD EFFECT TRANSISTOR DIGITAL FORWARD AND REVERSE COUNTING CIRCUIT

Filed April 22, 1966

*INVENTOR*
HAROLD Y. WONG

H. H. Losche
ATT'YS

United States Patent Office 3,500,064
Patented Mar. 10, 1970

3,500,064

FIELD EFFECT TRANSISTOR DIGITAL FORWARD AND REVERSE COUNTING CIRCUIT

Harold Y. Wong, Sunnyvale, Calif., assignor, by mesne assignments, to the United States of America as represented by the Secretary of the Navy Filed Apr. 22, 1966, Ser. No. 546,134
Int. Cl. H03k *21/00*
U.S. Cl. 307—222 6 Claims

ABSTRACT OF THE DISCLOSURE

A digital counting circuit utilizing field effect transistor (FET) bistable multivibrator circuits as bit counting stages which are interconnected with steering diodes and polarity reversing bias control means to provide addition by counting in the forward direction and subtraction by counting in the reverse direction. The FET counting stages are capable of functioning in a severe nuclear radiation environment thereby providing reliable performance in defense countermeasures systems including digital radar.

BACKGROUND OF THE INVENTION

This invention relates to a solid state digital counting circuit and more particularly to a counting circuit utilizing field effect transistor multivibrator circuits for each digital stage with bias switchable means to selectively count in the forward mode or to count in the reverse mode.

Field effect transistors (FET's) have been increasingly accepted by many electronic engineers as one of the basic semiconductor devices in circuit design. Because of the tremendous improvement of FET's dynamic characteristics through new geometries and through planar, passivation, and epitaxial techniques, it is now possible to use this device extensively in digital circuit application. When using the FET's for digital circuits, and especially in the multivibrator components of these circuits, it must be understood that some of the FET parameters can affect the circuit performance. These multivibrator circuits for digital circuitry have been constructed using bipolar transistors and vacuum tubes in the past. Needless to say the bipolar transistor replaced the vacuum tube in many instances to reduce bulk, weight, and heat, but the bipolar transistor is subject to nuclear radiation whereas the FET has the capability to resist severe nuclear radiation.

SUMMARY OF THE INVENTION

In the present invention a field effect transistor bistable multivibrator is designed for use in a digital counter where a plurality of such multivibrators are used. One of the criteria in multivibrator design is to make sure that it is stable under a steady state condition. The dynamic characteristics of N-channel FET's resemble those of a vacuum tube pentode and these N-channel FET's are used herein although the P-channel FET's could be used for reversed polarity conditions. Once the design of the single field effect transistor bistable multivibrator is accomplished for bistable stability, as will be described in more detail herein, the digital counter can be constructed in any number of bits or stages. The digital counter is further designed to advance the digital count for addition, or to reverse the digital count for subtraction, by switching the biases at strategic points. It is therefore a general object of this invention to provide a digital counter utilizing field effect transistor bistable multivibrator circuits as the bit counters which are switchably biased to count in the forward or reverse modes.

BRIEF DESCRIPTION OF THE DRAWING

These and other objects and the attendant advantages, features, and uses will become more apparent to those skilled in the art as a more detailed description proceeds when considered along with the accompanying drawing in which.

DESCRIPTION OF THE PREFERRED EMBODIMENT

Figure 1:
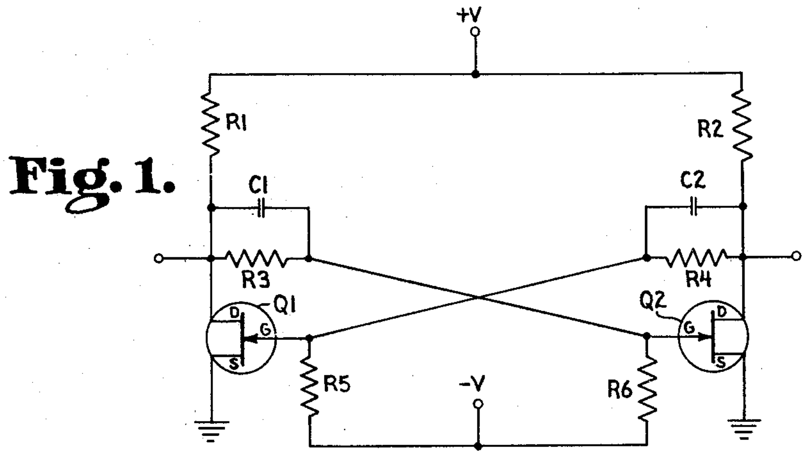
FIGURE 1 is a circuit schematic diagram of a field effect transistor multivibrator.

Referring more particularly to FIGURE 1 two FET's Q1 and Q2, each having a source electrode, a drain electrode, and a gate electrode, are used as the switching elements in a multivibrator circuit. The source electrode, S, of each of transistors Q1 and Q2 is coupled directly to a fixed potential, such as ground, while the drain electrodes, D, are coupled through load resistors R1 and R2, respectively, to a positive voltage source. Each gate electrode, G, of transistors Q1 and Q2 is coupled respectively through resistors R5 and R6 to a negative voltage source. The drain electrode of transistor Q1 is coupled through a parallel network consisting of resistor R3 and capacitor C1 to the gate electrode of transistor Q2 while, in the same manner, the drain electrode of transistor Q2 is coupled through the parallel circuit R4, C2 to the gate electrode of transistor Q1. The FET's, Q1 and Q2 herein shown, are N-channel transistors symbolized by having the gate electrode with an arrow directed into the source-drain junction although P-channel FET's could be utilized with the polarities on the source and drain electrodes reversed. Accordingly, the invention is not limited to the specific example of N-channel FET multivibrator circuits.

The FET multivibrator circuit shown in FIGURE 1 is the basic building block for a digital counter and one of the criteria in the multivibrator design is to make sure that it is stable under a steady state condition to provide a bisable multivibrator required for digital circuitry. In this FET multivibrator circuit the following equalities should exist:

R1=R2; R3=R4; R5=R6; C1=C2

To guarantee that the FET multivibrator meets the bistability criterion it is required that the following inequality be satisfied:

$$Gm > \frac{R3+R5}{R5}\left(\frac{1}{r_p}+\frac{1}{R1}+\frac{1}{R3+R5}\right) \qquad (1)$$

where:

$Gm$=transconductance of FET (micromhos).
$r_p$=dynamic on-resistance of FET (ohms).

One known FET found to provide good results for this multivibrator is the Amelco FE300, which has a typical $Gm$ and $r_p$ of 1700 micromhos and 15,000 ohms respectively. If the power supplies are arbitrarily chosen to be plus and minus 22 volts for the purpose of an operative example herein with the load resistor R1 of 9,100 ohms, this will yield a drain current approximately $$I_d=\frac{22}{9{,}100}=2.4 \text{ milliamperes}$$

where $I_d$ is the drain electrode current. R3 and R5 are chosen to be 33,000 and 61,900 ohms, respectively. Substituting the numerical values in Equation 1 yields:

$$1700(10^{-6}) > \frac{33+61.9}{61.9}\left(\frac{1}{1500}+\frac{1}{9100}+\frac{1}{(33+61.9)(10^3)}\right)$$

$$> 1.53(0.67+0.11+0.01)(10^{-3})$$

$$> 1209(10^{-6})$$

Figure 2:
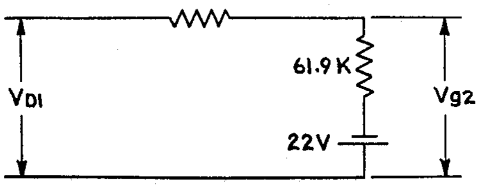
FIGURE 2 is an equivalent circuit of the gate voltage for the circuit of FIGURE 1.

It can be seen that this inequality is now satisfied and thus the bistability of the FET multivibrator circuit of FIGURE 1 is guaranteed. It is necessary to determine the pinch-off voltage of the "off" transistor and it should not exceed the specified maximum rating. Assuming that the FET transistor Q1 is conducting, the voltage at the junctions of R1, C1, and R3 is approximately 1 volt. The gate voltage $V_{g2}$ of the FET Q2 can be calculated from the equivalent circuit shown in FIGURE 2 where $V_{D1}$ is equal to 1 volt. The calculated gate voltage of the FET Q2 is the following:

$$V_{g2} = \frac{1+22}{33+61.9}(61.9) - 22$$

$$= 15 - 22$$

$$= -7 \text{ volts}$$

The typical pinch-off voltage of an Amelco FE300 FET is about −4.5 volts and the absolute maximum is −10 volts. Therefore the component values chosen are satisfactory and the FET is operated within a safety margin.

Figure 3:
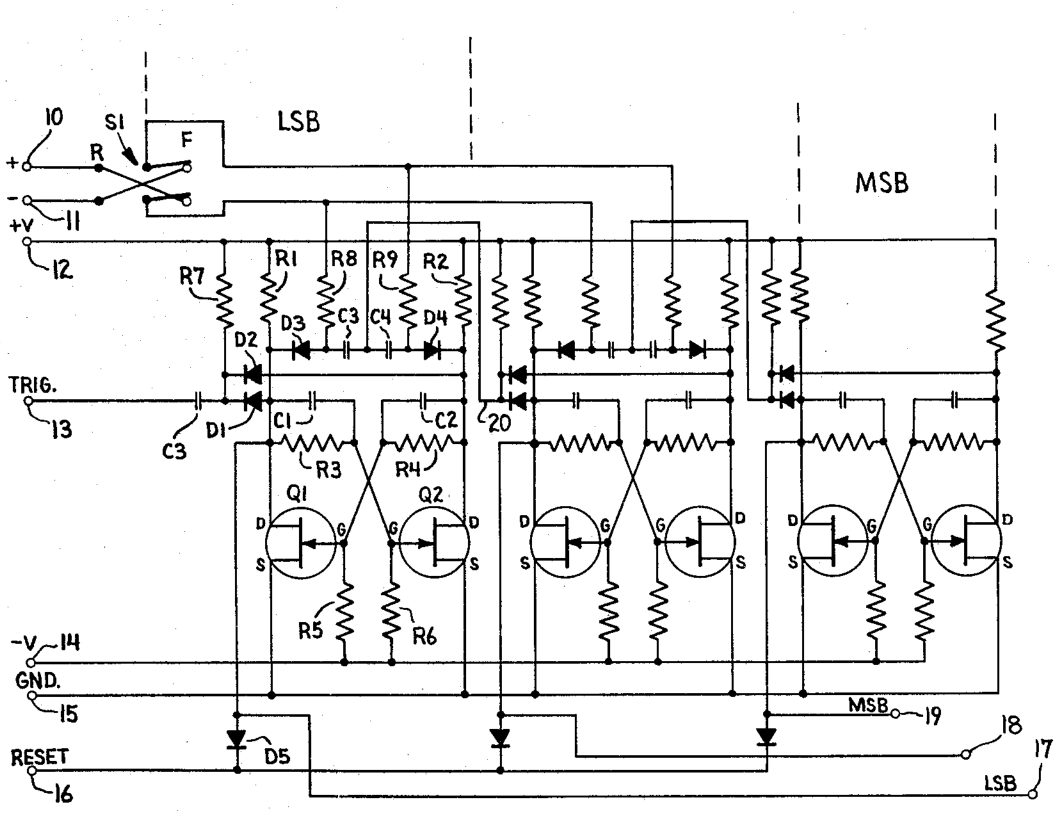
FIGURE 3 is a circuit schematic of a three-stage or bit digital counter using the field effect multivibrator circuits of FIGURE 1.

Referring more particularly to FIGURE 3, a digital counter of three stages or bits is shown using FET multivibrators of the type described in FIGURE 1, in which like reference characters apply to like parts. This digital counter is shown in three stages although any number of stages or bits could be used. The least significant bit (LSB) is shown to the left of FIGURE 3 while the most significant bit (MSB) is shown to the right of FIGURE 3 with one intermediate bit to exemplify, by way of example, one or more intermediate stages or bits which may be coupled in series in the same manner that the LSB and the intermediate bit is coupled herein. Since the coupling between the LSB and the intermediate stages are all the same, it is to be understood that the example of three bits is not to limit the number of stages in this invention. This digital counter of FIGURE 3 has voltage inputs at terminals 10, 11, 12, 14, and 15, and, as shown, a trigger input at terminal 13 and a reset trigger input at terminal 16. The positive voltage input at terminal 12 and the negative voltage input at terminal 14 correspond to the positive and negative voltages applied to like terminals in FIGURE 1.

In addition to the FET multivibrator circuit of FIGURE 1 all stages have steering diodes D1 and D2 from the trigger input which is capacitor coupled by C3 to the drain electrode of each FET Q1 and Q2. Trigger pulses applied to the terminal 13 will be negative pulses and accordingly the diodes D1 and D2 will be oriented with the cathodes thereof coupled to the trigger input source and the anodes thereof coupled directly to the drain terminals. The junction of the capacitor C3 and the cathodes of diodes D1 and D2 in common are biased through a resistor R7 from the positive voltage source at terminal 12. The drain electrode of the FET Q1 in each stage is coupled through a diode D5 to the reset terminal 16 with each diode D5 oriented with its cathode coupled to the reset source and its anode coupled to the drain terminal to produce reset of the whole counter with a negative pulse. The drain terminal of the FET Q1 in each stage provides the digital output for that stage, the LSB having an output terminal 17, the intermediate stage having an output terminal 18, and the MSB having an output terminal 19.

To enable the digital counter of FIGURE 3 to count in the forward or reverse mode all stages, but the MSB, includes an "AND" and "OR" gate network consisting of diodes D3 and D4 and capacitors C3 and C4 in series across the drain electrodes of the FET's Q1 and Q2. This series relation includes the diode D3 and D4 oriented with the cathodes thereof coupled directly to the drain electrodes of FET Q1 and FET Q2, respectively, and the anodes thereof coupled directly to one plate of the capacitors C3 and C4, respectively. The junction of the diode D3 and capacitor C3 is coupled through a biasing resistor R8 to a voltage source while the junction of the diodes D4 and capacitor C4 is through a biasing resistor R9 to a voltage source. Each of the biasing couplings with the diode constitutes an "AND" gate, as will later become clear. The voltage sources to biasing resistors R8 and R9 are through a reversing switch S1 from the voltage input terminals 10 and 11. Assuming that the voltage input at terminal 10 is positive and the voltage input at terminal 11 is negative and the reversing switch S1 is thrown as shown in FIGURE 3 to F (forward) terminals, a positive voltage will be applied to the junction of diode D3 and capacitor C3 while a negative voltage will be applied to the junction of diode D4 and capacitor C4. This will cause the digital counter of FIGURE 3 to count in a forward direction or mode as will become clear in the statement of operation. When switch S1 is thrown to its R (reverse) terminals, the digital counter of FIGURE 3 will count in the reverse direction or mode. The junction of capacitors C3 and C4 is coupled by conductor 20 as a trigger input to the steering diodes D1 and D2 of the next succeeding stage toward the MSB, each intermediate stage being so coupled to the next stage toward the MSB in like manner. The capacitors C3, C4 junction to the conductor 20 constitutes an "OR" gate, as will become clear in the description of operation. The MSB shown in FIGURE 3 will be switched in its bistable states in accordance with the preceding stages and, accordingly, does not need the forward and reverse bias circuitry. Since each multivibrator stage is identical in construction, except for the MSB, detailed description will not be given for the remaining stages.

OPERATION

In the operation of the digital counter of FIGURE 3 let it be assumed that all voltages are switched in circuit and that some of the stages are not in the zero state in which case the FET Q2 would be in conduction. It is understood that each stage is in its zero state when the FET Q1 element is in conduction producing a substantially zero voltage on its drain terminal, thus representthe digital "0." If one or more stages are in the "1" state, in which the FET Q2 is in conduction, the drain terminal of the FET Q1 element of that stage will be in a high voltage state approaching that of terminal 12 to produce a "1" digital output on 17, 18, or 19 for that stage. Reset of all stages to their "0" state is insured by applying a negative pulse to the reset terminal 16 which operates through the speed-up capacitor C1 on the gate terminal G of the FET Q2 cutting transistor Q2 off thereby switching transistor Q1 into conduction by applying the drain voltage rise on Q2 through the speed-up capacitor C2 to the gate electrode of Q1.

Now assuming that trigger pulses are applied to terminal 13 for count, the first negative trigger pulse will be operative through the steering diode D2 and the speed-up capacitor C2 to the gate electrode of Q1 switching conduction to Q2 in the LSB. The sudden rise in drain voltage on Q1 is blocked by the gate diode D3 having a positive voltage on its anode while at the same time the sudden drop in the drain voltage of Q2 appearing on the cathode of the gate diode D4 is ineffective since the anode of D4 is negative from terminal 11 through switch S1. The next succeeding trigger voltage on terminal 13 is operative through the steering diode D1 to switch conduction to transistor Q1 of the LSB thereby producing a negative pulse on the cathode of the gating diode D3 which will appear across capacitor C3 over conductor 20 to the steering diodes of the next stage towards the MSB to switch conduction to the transistor Q2 of this second stage since the anode voltage on the gating diode D3 was held positive through resistor R8. The next trigger pulse will again switch the LSB from Q1 conduction to Q2 conduction and succeeding pulses will cause transistors Q1 and Q2 in the LSB to switch, each switch to conduction of the Q1 transistor of the stages in the lower significant bit causing the transistors to switch in the stage next toward the MSB to provide a digital count. This count proceeds for addition as shown in the following Truth Table I:

TRUTH TABLE I

| FWD-REV state | | Counter state at time $t_0$ | | | Counter state at time $t_{0+1}$ | | |
|---|---|---|---|---|---|---|---|
| F | R | C | B | A | C | B | A |
| 1 | 0 | 0 | 0 | 0 | 0 | 0 | 1 |
| 1 | 0 | 0 | 0 | 1 | 0 | 1 | 0 |
| 1 | 0 | 0 | 1 | 0 | 0 | 1 | 1 |
| 1 | 0 | 0 | 1 | 1 | 1 | 0 | 0 |
| 1 | 0 | 1 | 0 | 0 | 1 | 0 | 1 |
| 1 | 0 | 1 | 0 | 1 | 1 | 1 | 0 |
| 1 | 0 | 1 | 1 | 0 | 1 | 1 | 1 |
| 1 | 0 | 1 | 1 | 1 | 0 | 0 | 0 |

where:

F=forward line
R=reverse line
A=least significant figure
B=intermediate significant bit
C=most significant figure Where it is desirable to reverse the counting mode, the selector switch S1 will be thrown to the R position thereby placing a negative voltage at the junction of D3, C3 and the positive voltage at the junction of D4, C4. Thus, where all stages are in the "1" state, providing the condition under which Q2 is conducting in each stage, the first negative triggering pulse at terminal 13 will cause conduction to switch from Q2 to Q1 in the LSB. This will produce a rapid voltage drop on the drain terminal of Q1 producing a negative pulse on the cathode of gating diode D3 but since its anode is already at a negative voltage, no pulse will be transmited over the conductor 20. By similar reasoning the sudden rise in the drain voltage of transistor Q2 of the LSB by virtue of this transistor being cut off in conduction will produce a positive voltage on the cathode of gating diode D4 but, since its anode voltage is already at a positive voltage, no pulse will be transmitted by way of conductor 20 to the next succeeding stage toward the MSB. The next succeeding trigger pulse at 13 will switch conduction from Q1 to Q2 in the LSB producing a sudden drop in the drain terminal voltage of Q2 producing a rapid drop across resistor R9 which is reflected through the capacitor C4 as a negative triggering pulse over conductor 20 to the next stage toward the MSB switching conduction from Q2 to Q1 in this second stage. Accordingly, the stages will be switched in this manner to count in the reverse or subtraction mode as shown in the following Truth Table II.

TRUTH TABLE II

| FWD-REV state | | Counter state at time $t_0$ | | | Counter state at time $t_{0+1}$ | | |
|---|---|---|---|---|---|---|---|
| F | R | C | B | A | C | B | A |
| 0 | 1 | 0 | 0 | 0 | 1 | 1 | 1 |
| 0 | 1 | 1 | 1 | 1 | 1 | 1 | 0 |
| 0 | 1 | 1 | 1 | 0 | 1 | 0 | 1 |
| 0 | 1 | 1 | 0 | 1 | 1 | 0 | 0 |
| 0 | 1 | 1 | 0 | 0 | 0 | 1 | 1 |
| 0 | 1 | 0 | 1 | 1 | 0 | 1 | 0 |
| 0 | 1 | 0 | 1 | 0 | 0 | 0 | 1 |
| 0 | 1 | 0 | 0 | 1 | 0 | 0 | 0 |

Accordingly, the digital counter as shown in FIGURE 3 utilizing FET multivibrator circuits, as shown in FIGURE 1, having good bistable charactertistics, is provided for either forward or reverse digital counting for as many stages as desired or needed. FET characteristics indicate their desirability for use in wide temperature ranges and accordingly this counter will function satisfactorily over a wide temperature range, it having been found that a temperature range of −10° F. to +150° F. with the repetition frequency rate of two kilocycles providing satisfactory operation. In general, triggering speed and triggering sensitivity should be high while power consumption and sensitivity to interference should be low. One great advantage of FET's is that they have the capability to resist severe nuclear radiation which provides good countermeasure capabilities for defense equipment, such as digital radar.

I claim:

1. A field effect transistor digital forward and reverse counting circuit comprising:

a plurality of bistable multivibrators coupled in series with one another, each of said multivibrators having a pair of field effect transistors, each of said transistors having source and drain conduction electrodes and a gate electrode, said multivibrators providing a digital bit counting circuit in which the first of said series-coupled multivibrators represents the least significant bit and the last represents the most significant bit;

a trigger input coupled through steering diodes to one of said conduction electrodes of the field effect transistors in the least significant bit multivibrator;

biasing circuit means including polarity-reversing switch means and a pair of gating diodes in series with a pair of capacitors, said capacitors being in series between said diodes, and said diodes each having the cathode thereof coupled respectively to one of the conduction electrodes of said pair of field effect transistors in each multivibrator bit, except the multivibrator of the most significant bit, the junction of one diode and its adjacent serially coupled capacitor being biased positively and the other diode and its adjacent serially coupled capacitor being biased negatively to provide a forward additive counting mode, said positive and negative biases being switchable by said polarity-reversing switch means to provide a reverse subtractive counting mode, and the juncture of said pair of capacitors being coupled to the trigger input of the next succeeding stage toward the most significant bit whereby the forward and reverse counting modes may be selectively chosen;

a reset circuit coupled through a diode to one of said conduction electrodes of the corresponding field effect transistor in each multivibrator bit, said reset circuit for enabling a reset pulse to place each multivibrator bit in a corresponding bistable state.

2. A field effect transistor digital counting circuit as set forth in claim 1 wherein said field effect transistors are N-channel transistors each having its source electrode coupled to a fixed potential, its drain electrode coupled to a positive voltage source through a drain load resistor, and its gate electrode biased from a negative voltage source.

3. A field effect transistor digital counting circuit as set forth in claim 2 wherein said coupling of the cathode of each gating diode to one of the conduction electrodes of said pair of field effect transistors is to the drain electrode constituting said one of said conduction electrodes, and wherein said reset circuit coupled through a diode to one of said conduction electrodes of said corresponding field effect transistor in each multivibrator bit is to said drain electrode constituting said one conduction electrode.

4. A field effect transistor bistable multivibrator for digital counting circuits comprising:

a pair of field effect transistors having two conduction electrodes and a gate electrode with one corresponding conduction electrode of each coupled respectively to the gate electrode of the other through a parallel resistance-capacitance network, having a supply voltage across said conduction electrodes and a gate biasing voltage applied to said gate electrode, and having a binary state output coupled to one of the conduction electrodes of one of said pair of field effect transistors;

a pair of gating diodes in series with a pair of capacitors coupled across corresponding conduction electrodes of said pair of field effect transistors with said gating diodes at the outer extremities of said series and with said capacitors in series between said gating diodes, the junction of each gating diode and adjacent capacitor being coupled through a biasing resistor to a voltage source, and the junction of said capacitors providing a trigger output;

a reverse switch coupling positive and negative voltage sources selectively to said biasing resistors;

a trigger input coupled through steering diodes to corresponding conduction electrodes of said pair of field effect transistors to cause said field effect transistors to alternate in conduction with each voltgae signal applied to said trigger input; and a reset input coupled to one conduction electrode of one of said pair of field effect transistors to cause one of said transistors to be stable in conduction after each voltage signal applied to said reset input whereby a bistable multivibrator circuit is established to switch from its reset bistable state in alternate bistable states with each input voltage pulse to produce trigger output pulses in correspondence with said binary state output and out of correspondence with said binary state output in accordance with the selected position of said reversing switch.

5. A field effect transistor bistable multivibrator as set forth in claim 4 wherein said pair of field effect transistors are N-channel transistors and said conduction electrodes to which said trigger input, said reset input, said gating diodes, and said binary state output are coupled constitutes said drain electrode.

6. A field effect transistor bistable multivibrator as set forth in claim 5 wherein said pair of gating diodes each has the cathode thereof coupled to said drain electrodes and wherein said steering diodes each has the anode thereof coupled to said drain electrodes.

References Cited

UNITED STATES PATENTS

| | | | |
|---|---|---|---|
| 2,977,539 | 3/1961 | Townsend | 307—222 |
| 3,114,075 | 12/1963 | Apel | 328—44 XR |
| 3,284,782 | 11/1966 | Burns | 307—304 XR |
| 3,363,115 | 1/1968 | Stephenson et al. | 307—304 XR |

JOHN S. HEYMAN, Primary Examiner

STANLEY T. KRAWCZEWICZ, Assistant Examiner

U.S. Cl. X.R.

307—251, 279; 328—48